(12) United States Patent
Lin et al.

(10) Patent No.: US 6,967,500 B1
(45) Date of Patent: Nov. 22, 2005

(54) ELECTRONIC CIRCUIT WITH ON-CHIP PROGRAMMABLE TERMINATIONS

(75) Inventors: Mou C. Lin, High Bridge, NJ (US); William Andrews, Emmaus, PA (US); Arifur Rahman, Yonkers, NY (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 203 days.

(21) Appl. No.: 10/397,669

(22) Filed: Mar. 26, 2003

Related U.S. Application Data

(60) Provisional application No. 60/429,831, filed on Nov. 27, 2002.

(51) Int. Cl.[7] ............................................. H03K 17/16
(52) U.S. Cl. ............................ 326/30; 326/38; 326/44
(58) Field of Search ............................. 326/30, 38, 39, 326/41, 44, 45

(56) References Cited

U.S. PATENT DOCUMENTS

| | | | |
|---|---|---|---|
| 6,060,907 A * | 5/2000 | Vishwanthaiah et al. | ..... 326/87 |
| 6,445,245 B1 * | 9/2002 | Schultz et al. | ............... 327/541 |
| 6,480,026 B2 | 11/2002 | Andrews et al. | |
| 6,617,986 B2 * | 9/2003 | Connor et al. | ................. 341/97 |
| 6,633,178 B2 * | 10/2003 | Wilcox et al. | ................. 326/30 |

OTHER PUBLICATIONS

U.S. Appl. No. 10/628,657, filed Jul. 28, 2003, Lin et al.

* cited by examiner

*Primary Examiner*—Daniel Chang

(57) ABSTRACT

An electronic circuit with programmable terminations includes a circuit block, signal pads coupled to the circuit block, programmable termination circuits each associated with a corresponding one of the signal pads, and a reference circuit operative to generate one or more control signals for application to the programmable termination circuits. A given one of the programmable termination circuits is configurable independently of at least one of the other programmable termination circuits into one of a plurality of termination states. Preferably, the programmable termination circuits are each independently configurable to provide a particular termination resistance and a particular supply terminal connection type for the associated signal pad. The invention is particularly well suited for use in integrated circuit applications, such as, for example, those involving FPGAs, FPSCs and ASICs.

21 Claims, 2 Drawing Sheets

ELECTRONIC CIRCUIT WITH ON-CHIP PROGRAMMABLE TERMINATIONS

RELATED APPLICATION(S)

The present application claims the priority of U.S. Provisional Patent Application Ser. No. 60/429,831, filed Nov. 27, 2002 and entitled "Electronic Circuit with On-Chip Programmable Terminations."

TECHNICAL FIELD

The present invention relates generally to the field of electronic circuits, and more particularly to signal line termination techniques for use in an integrated circuit or other type of electronic circuit.

BACKGROUND

It is often desirable to provide termination resistors or other programmable terminations for input and output signal lines in an integrated circuit. For example, termination resistors may be incorporated into the integrated circuit in order to match input and output impedances of respective receiver and driver circuitry of the integrated circuit to impedances of corresponding circuitry or traces on an associated circuit board. As is well known, impedance matching of this type is beneficial in that it reduces signal reflections and associated effects such as ringing, loss, standing waves, etc. Termination resistors that are incorporated into a given integrated circuit are commonly referred to as "on-chip" termination resistors.

A significant drawback of conventional on-chip termination resistors is that such resistors and their associated control circuitry generally fail to provide a sufficient level of programmability. For example, the conventional techniques may require that multiple input or output pads in a given group of pads all be biased from the same supply voltage terminal and have the same value of termination resistance. Moreover, such techniques may require that one or two pads in each group of pads be used for providing references for control of termination resistance, which reduces the number of pads which can be used for input or output signal lines.

As a result, the conventional techniques may unduly limit circuit performance or restrict circuit configuration flexibility in certain integrated circuit applications, such as, for example, those involving field programmable gate array (FPGAs), field programmable system chips (FPSCs), or application-specific integrated circuits (ASICs).

It is therefore apparent that a need exists for improved techniques for providing programmable terminations in an integrated circuit or other electronic circuit.

SUMMARY

The present invention provides on-chip signal line terminations with improved programmability relative to the conventional arrangements described above.

In accordance with one aspect of the invention, an electronic circuit with programmable terminations includes a circuit block, signal pads coupled to the circuit block, programmable termination circuits each associated with a corresponding one of the signal pads, and a reference circuit operative to generate one or more control signals for application to the programmable termination circuits. A given one of the programmable termination circuits is configurable independently of at least one of the other programmable termination circuits into one of a plurality of termination states. The reference circuit is preferably operative to generate a set of reference control signals, and each of the programmable termination circuits is preferably adapted to receive the set of reference control signals.

In accordance with another aspect of the invention, a given one of the programmable termination circuits comprises a plurality of selectable termination resistance circuits coupled together in parallel, with each of the selectable termination resistance circuits comprising one or more resistors controllably connectable between the associated signal pad and a supply terminal. The given programmable termination is configurable such that enablement of different numbers of the plurality of selectable termination resistance circuits alters a termination resistance coupled to the associated signal pad.

In accordance with another aspect of the invention, a given one of the programmable termination circuits may comprise a plurality of unit cells connected in parallel, such that enablement of particular ones of the unit cells determines an amount of termination resistance provided between an associated signal pad and a supply terminal.

In an illustrative embodiment of the invention, the programmable termination circuits are each independently configurable to provide a particular termination resistance and a particular supply terminal connection type for the associated signal pad. For example, a given one of the programmable termination circuits may be configured so as to permit termination of the associated signal pad to any one of a plurality of supply terminals or to selected combinations of multiple ones of the supply terminals.

The invention is particularly well suited for use in integrated circuit applications, such as, for example, those involving FPGAs, FPSCs and ASICs.

DETAILED DESCRIPTION

The present invention will be illustrated herein as implemented in an exemplary electronic circuit comprising at least one integrated circuit. It should be understood, however, that the invention does not require the use of the particular circuit configurations of the illustrative embodiments, and is more generally suitable for use in any integrated circuit or other electronic circuit application in which it is desirable to provide improved circuit performance or reduced circuit cost, or both, through the use of programmable terminations. For example, the invention can be implemented in an FPGA, an FPSC, an ASIC, or another type of electronic circuit.

Figure 1A:
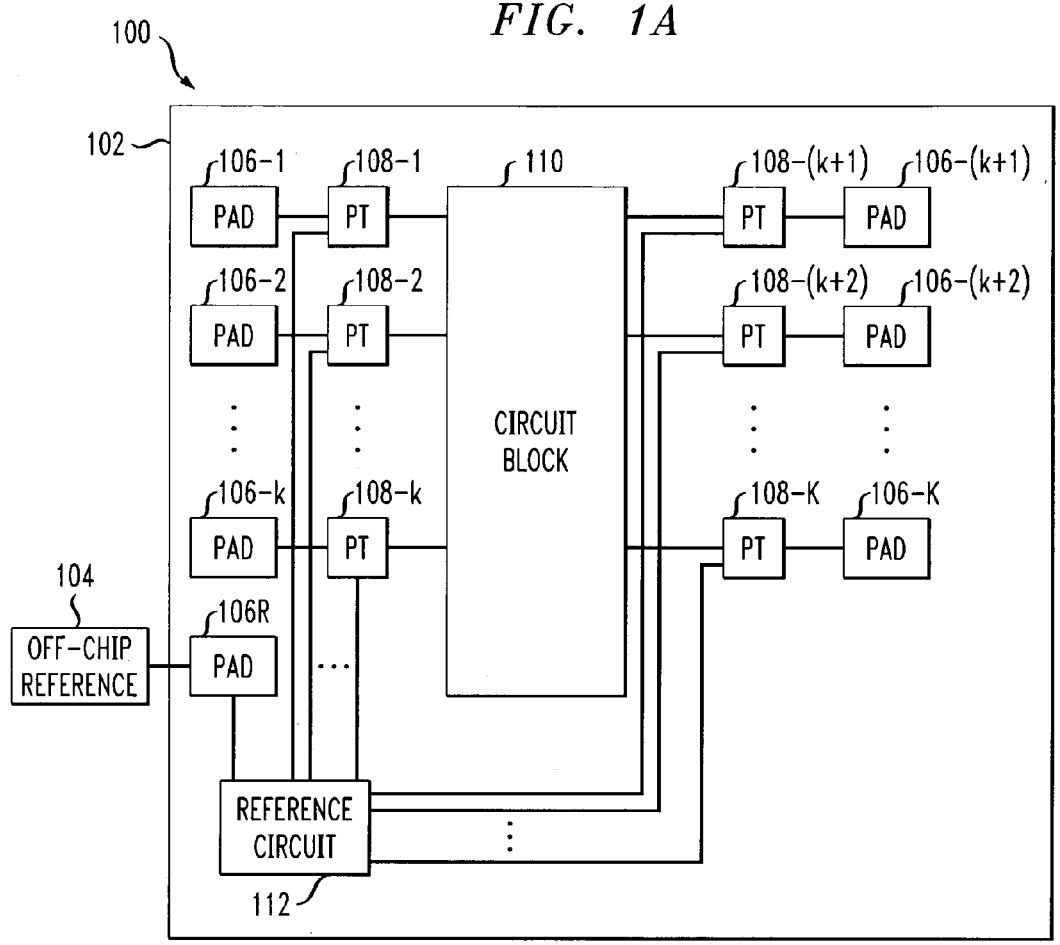
FIG. 1A is a block diagram of an electronic circuit configured with programmable terminations in accordance with an illustrative embodiment of the invention.

FIG. 1A shows an electronic circuit 100 configured in accordance with an illustrative embodiment of the invention. The electronic circuit 100 includes at least one integrated circuit 102 and an off-chip reference 104 coupled to the integrated circuit 102. The integrated circuit 102 comprises a plurality of signal pads 106, an additional pad 106R coupled to the off-chip reference 104, a plurality of programmable termination (PT) circuits 108 each associated with a corresponding one of the signal pads, at least one circuit block 110, and a reference circuit 112. A particular one of the signal pads 106 having associated therewith one of the programmable termination circuits 108 is denoted as 106-$i$, where i=1, 2, . . . k . . . K, with the associated programmable termination circuit being denoted as 108-$i$.

The signal pads 106, other than signal pad 106R, are each coupled to the circuit block 110, and are utilized to interface input and output signal lines of circuit block 110 to the environment external to the integrated circuit 102. For example, the signal pads 106 may each be wire-bonded or otherwise connected to a corresponding lead of a leadframe of the integrated circuit 102, although such a leadframe is not shown in the diagram. Other interconnection arrangements known in the art may be used to couple the signal pads 106, or suitable subsets thereof, to external circuitry or other external connections.

The programmable termination circuits 108 in this embodiment provide programmable termination resistors for the corresponding signal pads 106, as will be described in greater detail below in conjunction with FIG. 2. In accordance with the invention, the programmable termination circuits 108 are "pad-wise" controllable, that is, a given one of the programmable termination circuits 108-$i$ is configurable independently of at least one of the other programmable termination circuits into one of a plurality of termination states. Preferably, each programmable termination circuit 108-$i$ can provide a particular selectable termination resistance for the corresponding signal pad 106-$i$, independently of the termination resistances provided by the other programmable termination circuits for their corresponding signal pads. As will be described below, in a preferred embodiment, the programmable termination circuits 108 also permit selection, on a pad-wise basis, of termination of a given pad to an upper supply voltage terminal, a lower supply voltage terminal, or both.

The pads 106, programmable termination circuits 108, circuit block 110 and reference circuit 112 are illustratively shown in FIG. 1A as comprising "on-chip" elements, that is, elements which are part of the integrated circuit 102. However, although such an arrangement is a preferred configuration of the invention, the invention does not require that any particular grouping of these elements be arranged on-chip.

The circuit block 110 may represent any arrangement of circuitry that is associated with the integrated circuit 102 and connectable to at least a subset of the signal pads 106. For example, the circuit block 110 may comprise a particular set of logic circuitry or other functional circuitry associated with the integrated circuit 102. Also, the circuit block 110 may comprise multiple distinct blocks of circuitry within the integrated circuit 110. The term "circuit block" as used herein is therefore intended to be construed broadly so as to encompass any arrangement of circuitry connectable to one or more signals pads in an integrated circuit or other electronic circuit. It is to be appreciated that the integrated circuit 102 as shown in FIG. 1A is considerably simplified for purposes of illustration, and numerous other arrangements of integrated circuit elements can be used in implementing the invention.

Although there is a separate programmable termination circuit 108-$i$ associated with each of the signal pads 106-$i$ in the embodiment illustrated in FIG. 1A, this is by way of example only. Other embodiments of the invention can utilize different arrangements of pads and termination circuits, and each pad in the electronic circuit 100 need not have a corresponding programmable termination circuit.

The reference circuit 112 is operative to generate one or more control signals for application to the programmable termination circuits 108. In this embodiment, the reference circuit 112 generates a set of reference control signals that are applied to each of the programmable termination circuits 108, as will be described in greater detail below in conjunction with FIG. 3. This is not a requirement of the invention, however, and in other embodiments the reference circuit 112 may supply a given set of control signals to only a subset of the programmable termination circuits 108, or may generate multiple sets of control signals each for application to one or more of the programmable termination circuits 108.

Figure 1B:
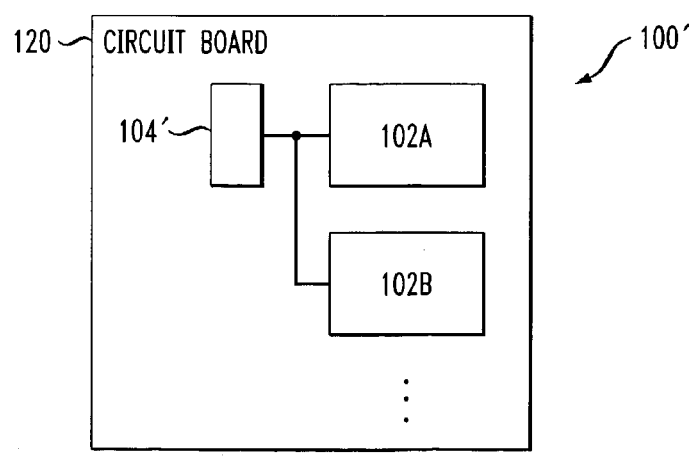
FIG. 1B shows a circuit board containing multiple integrated circuits of the type shown in FIG. 1A.

As indicated previously, the electronic circuit 100 may comprise one or more integrated circuits. FIG. 1B shows one possible example of a multiple integrated circuit arrangement of this type, wherein an electronic circuit 100' comprises a circuit board 120 having at least first and second integrated circuits 102A and 102B installed thereon. Each of the integrated circuits 102A and 102B is configured in substantially the same manner as integrated circuit 102 of FIG. 1A. Also installed on the circuit board 120 is an off-chip multi-circuit reference 104', which in this example is coupled to each of the integrated circuits 102A and 102B. The reference 104' will typically have a resistance value of Rref/L, where Rref in this example denotes an off-chip reference resistance having a value suitable for use with a single integrated circuit 102, and L denotes the total number of integrated circuits 102A, 102B, etc. coupled to the multi-circuit reference 104'.

Figure 2:
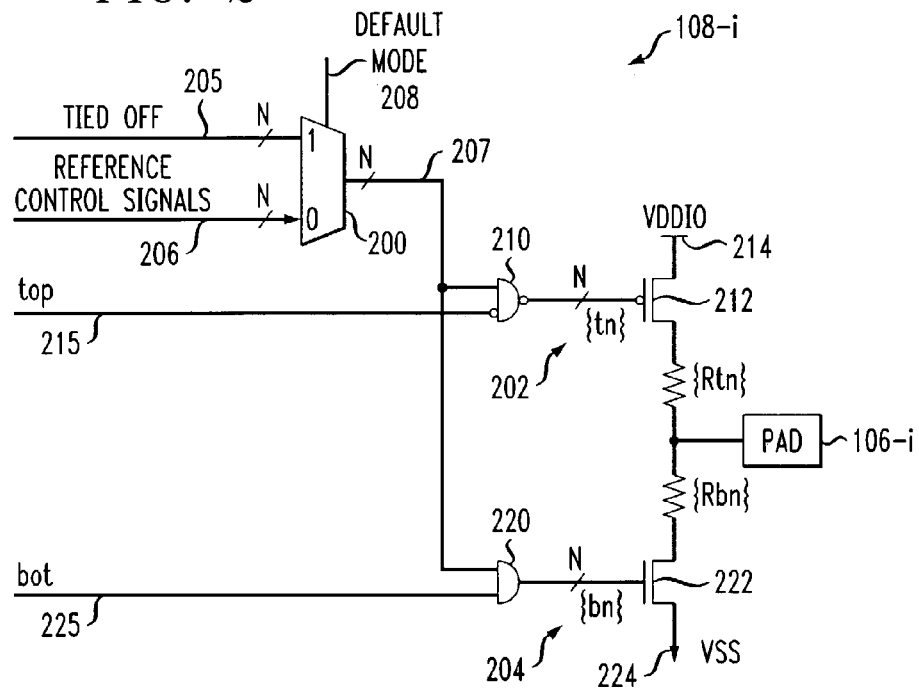
FIG. 2 is a schematic diagram of one possible implementation of a programmable termination circuit suitable for use in the electronic circuit of FIG. 1A in accordance with the invention.

FIG. 2 shows an example programmable termination circuit 108-$i$ suitable for use in the electronic circuit of FIG. 1A in accordance with the invention. The programmable termination circuit 108-$i$ is coupled to an associated signal pad 106-$i$, and includes a selection circuit 200, a first logic circuit 202 and a second logic circuit 204.

The selection circuit 200, shown illustratively in FIG. 2 as a multiplexer, has a first input 205 adapted to receive a set of default signals and a second input 206 adapted to receive a set of reference control signals from the reference circuit 112. Each of these sets of signals is shown, by way of example, as including a total of N signals, with a particular one of the signals in a given set of N signals being denoted as the nth signal, where n=1, 2, . . . N. In addition, the set of default signals applied to first input 205 in this embodiment comprises so-called "tied off" signals, e.g., signals tied to particular voltage levels.

The selection circuit 200 is adapted to select one of the sets of signals applied to the inputs 205 and 206 for delivery to an output 207 of the selection circuit, in response to a select signal applied to an input 208. A logic "1" level applied to the input 208 causes the selection circuit 200 to enter a default mode, in which the set of default signals is propagated to the output 207. A logic "0" applied to the input 208 causes the selection circuit to select the set of reference control signals at input 206 for propagation to the output 207.

The first logic circuit 202 includes at least one logic gate 210 having an input coupled to the output 207 of the selection circuit 200, and an output connected to an input of a P-type Metal-Oxide-Semiconductor (PMOS) transistor 212. The PMOS transistor 212 controls the connection of one or more resistances Rtn, n=1, 2, . . . N, between the signal pad 106-*i* and a first supply voltage terminal 214, denoted in this example as corresponding to a supply terminal VDDIO. The logic gate 210 in this example comprises a two-input NAND gate, although other types of logic gates may be used.

The terms "supply voltage terminal" and "supply terminal" as used herein are intended to include, by way of example and without limitation, a circuit node, line or connection associated with VDD, VDDIO, VSS, ground, or other circuit potential. A given supply voltage terminal may thus correspond to a positive, negative or ground potential.

The first logic circuit 202 is adapted to control an amount of resistance provided between the associated signal pad 106-*i* and the first supply voltage terminal 214, responsive to the selected set of signals at the output 207 of the selection circuit 202. In a preferred implementation, the first logic circuit 202 is operative to select one of a connected state and a disconnected state for each of N resistors controllably connectable between the signal pad 106-*i* and the first supply voltage terminal 214.

The use of the VDDIO supply terminal as the upper supply voltage terminal 214 in this illustrative embodiment may be beneficial in that the invention allows different ones of the pads 106, even adjacent pads, to be terminated to different VDDIO supplies.

The logic gate 210 and PMOS transistor 212 may be viewed as parallel arrangements of N multiple logic gates and N multiple PMOS transistors, respectively. A given one of the parallel logic gates comprising logic gate 210 receives one of the N signals in the selected set of signals from the selection circuit 200, and generates an output control signal tn for application to an input of a corresponding one of the parallel transistors comprising the transistor 212. This control signal tn controls the selection of one of a connected state and a disconnected state for a corresponding one of the N resistors controllably connectable between the signal pad 106-*i* and the first supply voltage terminal 214.

Each of the control signals {tn} thus controls a corresponding one of the termination resistances {Rtn} so as to provide a desired termination resistance Rtop between the signal pad 106-*i* and the supply voltage terminal 214, where Rtop is a parallel combination of the particular ones of the N parallel resistors that are in the connected state based on the particular values of the control signals {tn}.

The logic gate 210 also receives via an input 215 a signal top, which may be used to disable the passage of the selected signal set through the logic gate 210. More specifically, when the signal top is at a logic "1" level, the output of the logic gate 210 will be forced to a logic "1" value regardless of the particular logic values of the selected signals. As a result, the PMOS transistor 212 will be turned off, such that none of the parallel resistors {Rtn} are in the connected state, and the pad 106-*i* will not be terminated to the VDDIO supply terminal 214.

The second logic circuit 204 includes at least one logic gate 220 having an input coupled to the output 207 of the selection circuit 200, and an output connected to an input of an N-type Metal-Oxide-Semiconductor (NMOS) transistor 222. The NMOS transistor 222 controls the connection of one or more resistances Rbn, n=1, 2, . . . N, between the signal pad 106-*i* and a second supply voltage terminal 224, denoted in this example as corresponding to a supply terminal VSS. The logic gate 220 in this example comprises a two-input AND gate, although other types of logic gates may be used.

The second logic circuit 204 is thus adapted to control an amount of resistance provided between the associated signal pad 106-*i* and the second supply voltage terminal 224, responsive to the selected set of signals at the output 207 of the selection circuit 202. In a preferred implementation, the second logic circuit 204 is operative to select one of a connected state and a disconnected state for each of N resistors controllably connectable between the signal pad 106-*i* and the second supply voltage terminal 224.

The logic gate 220 and NMOS transistor 222 may be viewed as parallel arrangements of N multiple logic gates and N multiple NMOS transistors, respectively. A given one of the parallel logic gates comprising logic gate 220 receives one of the N signals in the selected set of signals from the selection circuit 200, and generates an output control signal bn for application to an input of a corresponding one of the parallel transistors comprising the transistor 222. This control signal bn controls the selection of one of a connected state and a disconnected state for a corresponding one of the N resistors controllably connectable between the signal pad 106-*i* and the second supply voltage terminal 224.

Each of the control signals {bn} thus controls a corresponding one of the termination resistances {Rbn} so as to provide a desired termination resistance Rbot between the signal pad 106-*i* and the supply voltage terminal 224, where Rbot is a parallel combination of the particular ones of the N parallel resistors that are in the connected state based on the particular values of the control signals {bn}.

The logic gate 220 also receives via an input 225 a signal bot, which may be used to disable the passage of the selected signal set through the logic gate 220. More specifically, when the signal bot is at a logic "0" level, the output of the logic gate 220 will be forced to a logic "0" value regardless of the particular logic values of the selected signals. As a result, the NMOS transistor 222 will be turned off, such that none of the parallel resistors {Rbn} are in the connected state, and the pad 106-*i* will not be terminated to the VSS supply terminal 224.

The programmable termination circuit 108-*i* is therefore configured to permit termination of the associated signal pad 106-*i* to either the upper supply terminal 214, the lower supply terminal 224, or both, through appropriate configuration of the signals top and hot. More generally, the programmable termination circuit 108-*i* may be configured so as to permit termination of its associated signal pad to any one of a plurality of supply voltage terminals or to selected combinations of multiple ones of the supply voltage terminals. Moreover, the termination resistances for termination to the upper supply terminal 214 and termination to the lower supply terminal 224 may be made separately and independently controllable.

It should be noted that the circuitry shown in FIG. 2 may be viewed as comprising a single unit cell, and that multiple such unit cells may be connected in parallel in order to provide further controllability of termination resistance. For example, each of the unit cells in a given multiple-cell programmable termination circuit 108-*i* may include N selectable termination resistances for termination of the associated signal pad 106-*i* to each of the upper and lower supply voltage terminals, thereby providing total termination resistances Rtop and Rbot for termination to the respective upper and lower supply voltage terminals. By connecting a number M of such unit cells together in parallel, the resultant termination resistance to the upper supply voltage terminal can be set to Rtop/m, where m=1, 2, . . . M, and denotes the particular number of the total set of M unit cells that are enabled within the corresponding programmable termination circuit at a given point in time. Similarly, the resultant termination resistance to the lower supply voltage terminal can be set to Rbot/m, with m again denoting the particular number of the total set of M unit cells that are enabled at a given point in time. It is also possible to provide different numbers of parallel-connected unit cells for use with termination to different supply voltage terminals.

By providing such a configuration of multiple separately-controllable parallel-connected unit cells in at least a subset of the programmable termination circuits 108, the termination resistances provided within each of these circuits can be set independent of one another to different values of Rtop/m and Rbot/m in the manner indicated above. Suitable modification of the FIG. 2 programmable termination circuit to include multiple parallel-connected unit cells can be implemented in a straightforward manner, as will be readily apparent to those skilled in the art.

The integrated circuit 102 as shown in the illustrative embodiment of FIG. 1A is thus configurable to provide programmable selection of both termination resistance and supply terminal connection type, on a pad-wise basis, for each of the signal pads 106 other than the reference signal pad 106R.

It is to be appreciated that the programmable termination circuit 108-$i$ as described in conjunction with FIG. 2 is shown by way of example only. Those skilled in the art will recognize that numerous alternative arrangements of circuitry may be used to implement a programmable termination circuit in accordance with the invention.

Figure 3:
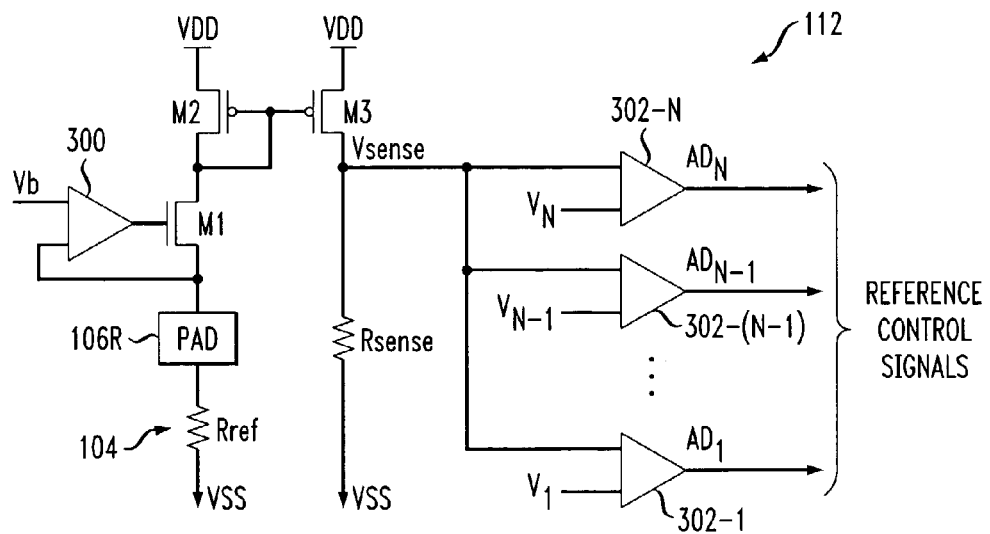
FIG. 3 is a schematic diagram of a reference circuit suitable for use in the electronic circuit of FIG. 1A in accordance with the invention.

FIG. 3 shows an example reference circuit 112 suitable for use in the electronic circuit of FIG. 1A in accordance with the invention. As indicated previously, the reference circuit 112 is coupled via reference signal pad 106R to an off-chip reference 104. In this example, the off-chip reference comprises an off-chip reference resistor Rref coupled to a supply voltage terminal VSS, although other on-chip or off-chip reference circuitry could be used in alternative embodiments. The reference circuit 112 in this example comprises comparators 300, 302-1, 302-2, . . . 302-N, NMOS transistor M1, PMOS transistors M2 and M3, and an on-chip reference resistor Rsense coupled between M3 and the lower supply voltage terminal VSS as shown. The reference circuit 112 is operative to generate a set of reference control signals, denoted $AD_1, AD_2, \ldots AD_{N-1}, AD_N$, at the outputs of the comparators 302. These control signals provide adjustment in the selected termination resistances within the programmable termination circuits 108 based on factors such as process, voltage and temperature variations. Each of the programmable termination circuits 108 is preferably adapted to receive this set of reference control signals.

The comparator 300 receives as inputs a voltage Vb and a voltage established across the off-chip reference resistor Rref, and generates an output which is applied to a gate of M1. The on-chip reference resistor Rsense in conjunction with transistors M1, M2 and M3 develops a voltage Vsense which is applied to one input of each of the comparators 302. The comparators 302-1, 302-2, . . . 302-N compare the voltage Vsense with fixed reference voltages $V_1, V_2, \ldots V_N$, respectively. The on-chip reference resistor Rsense is preferably the same type of resistor as that used for the off-chip termination resistors in a given application, e.g., termination resistors on the circuit board 120 or within another integrated circuit in the FIG. 1B arrangement. The reference circuit 112 in the present illustrative embodiment can be located at any convenient location within the integrated circuit 102.

It should be understood that the particular reference circuit 112 as described in conjunction with FIG. 3 is shown by way of example only. Those skilled in the art will recognize that numerous alternative arrangements of circuitry may be used to implement a reference circuit in accordance with the invention. For example, the reference circuit 112 can be implemented without the use of a signal pad for connecting to an external reference circuit.

The reference circuit 112 may be configured to utilize techniques described in U.S. Pat. No. 6,480,026, issued Nov. 12, 2002 in the name of inventors W. B. Andrews et al. and entitled "Multi-functional I/O buffers in a field programmable gate array (FPGA)," which is incorporated by reference herein.

As indicated previously, the above-described embodiments of the invention are intended to be illustrative only, and numerous alternative embodiments within the scope of the appended claims will be apparent to those skilled in the art. For example, the invention can be implemented in embodiments in which the off-chip reference 104 is replaced with one or more on-chip references or a combination of on-chip and off-chip references. In addition, the particular types of logic gates, transistors and other circuitry may be replaced with alternative arrangements capable of providing the described programmable terminations for at least a subset of the signal pads of an integrated circuit. For example, selectable termination resistors can be replaced with other types of selectable termination impedances. Moreover, the use of integrated circuit input and output signal pads and resistive terminations is by way of illustration and not limitation. The techniques of the invention are not restricted to use with any particular type or arrangement of signal pads or terminations. Furthermore, the invention can be implemented in any type of integrated circuit, including an FPGA, FPSC or ASIC, as well as other electronic circuits.

What is claimed is:

1. An electronic circuit comprising:
   at least one circuit block;
   a plurality of signal pads coupled to the circuit block;
   a plurality of programmable termination circuits, each associated with a corresponding one of the signal pads; and
   a reference circuit operative to generate one or more control signals for application to the programmable termination circuits;
   a given one of the programmable termination circuits being configurable independently of at least one of the other programmable termination circuits into one of a plurality of termination states,
   wherein the given one of the programmable termination circuits comprises:
   a selection circuit having a first input adapted to receive a set of default signals and a second input adapted to receive a set of reference control signals from the reference circuit, the selection circuit being adapted to select one of the sets of signals for delivery to an output of the selection circuit;
   a first logic circuit having an input coupled to the output of the selection circuit, the first logic circuit being adapted to control an amount of resistance provided between the associated signal pad and a first supply terminal, responsive to the selected set of signals at the output of the selection circuit; and
   a second logic circuit having an input coupled to the output of the selection circuit, the second logic circuit being adapted to control an amount of resistance provided between the associated signal pad and a second supply terminal, responsive to the selected set of signals at the output of the selection circuit.

2. The electronic circuit of claim 1 wherein each of at least a subset of the programmable termination circuits is independently configurable to provide at least one of a particular termination resistance and a particular supply terminal connection type for the associated signal pad.

3. The electronic circuit of claim 1 wherein the plurality of signal pads includes a single signal pad coupled between the reference circuit and an off-chip reference.

4. The electronic circuit of claim 3 wherein the off-chip reference comprises an off-chip reference resistor coupled to a supply terminal.

5. The electronic circuit of claim 1 wherein the reference circuit is operative to generate a set of reference control signals, and each of the programmable termination circuits is adapted to receive the set of reference control signals.

6. The electronic circuit of claim 1 wherein the given one of the programmable termination circuits comprises at least one programmable termination resistor.

7. The electronic circuit of claim 1 wherein the selection circuit comprises a multiplexer.

8. The electronic circuit of claim 1 wherein the first logic circuit comprises at least one logic gate having an input coupled to the output of the selection circuit, and an output connected to an input of a transistor, the transistor controlling the connection of at least one resistance between the signal pad and the first supply terminal.

9. The electronic circuit of claim 1 wherein the second logic circuit comprises at least one logic gate having an input coupled to the output of the selection circuit, and an output connected to an input of a transistor, the transistor controlling the connection of at least one resistance between the signal pad and the second supply terminal.

10. The electronic circuit of claim 1 wherein the first logic circuit is operative to select one of a connected and a disconnected state for each of a plurality of resistors controllably connectable between the signal pad and the first supply terminal.

11. The electronic circuit of claim 1 wherein the second logic circuit is operative to select one of a connected and a disconnected state for each of a plurality of resistors controllably connectable between the signal pad and the second supply terminal.

12. The electronic circuit of claim 1 wherein the given one of the programmable termination circuits comprises a plurality of selectable termination resistance circuits coupled together in parallel, each of the selectable termination resistance circuits comprising at least one resistor controllably connectable between the associated signal pad and a supply terminal, the given programmable termination circuit being configurable such that enablement of different numbers of the plurality of selectable termination resistance circuits alters a termination resistance coupled to the associated signal pad.

13. The electronic circuit of claim 1 wherein the given one of the programmable termination circuits is configured so as to permit termination of the associated signal pad to any one of a plurality of supply terminals or to selected combinations of multiple ones of the supply terminals.

14. The electronic circuit of claim 1 wherein the given one of the programmable termination circuits comprises a plurality of unit cells connected in parallel, such that enablement of particular ones of the unit cells determines an amount of termination resistance provided between an associated signal pad and a supply terminal.

15. The electronic circuit of claim 1 wherein the given one of the programmable termination circuits is configured so as to permit termination of the associated signal pad to one of a plurality of different termination impedances.

16. The electronic circuit of claim 1 wherein the electronic circuit comprises an integrated circuit.

17. The electronic circuit of claim 1 wherein the electronic circuit comprises one of an FPGA, an FPSC and an ASIC.

18. An electronic circuit comprising:
a circuit block;
a signal pad coupled to the circuit block;
a programmable termination circuit associated with the signal pad; and
a reference circuit operative to generate one or more control signals for application to the programmable termination circuit;
the programmable termination circuit comprising:
a selection circuit having a first input adapted to receive a set of first signals and a second input adapted to receive a set of reference control signals from the reference circuit, the selection circuit being adapted to select one of the sets of signals for delivery to an output of the selection circuit; and
a logic circuit having an input coupled to the output of the selection circuit, the logic circuit being adapted to control an amount of resistance provided between the associated signal pad and a supply terminal, responsive to the selected set of signals at the output of the selection circuit.

19. The electronic circuit of claim 18 wherein the logic circuit is operative to select one of a connected and a disconnected state for each of a plurality of resistors controllably connectable between the signal pad and the supply terminal.

20. The electronic circuit of claim 18 wherein the electronic circuit comprises an integrated circuit.

21. The electronic circuit of claim 18 wherein the electronic circuit comprises one of an FPGA, an FPSC and an ASIC.

* * * * *